(12) United States Patent
Dodd et al.

(10) Patent No.: US 6,618,791 B1
(45) Date of Patent: Sep. 9, 2003

(54) SYSTEM AND METHOD FOR CONTROLLING POWER STATES OF A MEMORY DEVICE VIA DETECTION OF A CHIP SELECT SIGNAL

(75) Inventors: James M. Dodd, Shingle Springs, CA (US); Michael W. Williams, Citrus Heights, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/677,138

(22) Filed: Sep. 29, 2000

(51) Int. Cl.[7] .............................................. G06F 12/00
(52) U.S. Cl. ..................................................... 711/105
(58) Field of Search ......................................... 711/105

(56) References Cited

U.S. PATENT DOCUMENTS

| | | | |
|---|---|---|---|
| 4,710,903 A | * 12/1987 | Hereth et al. | ............... 365/194 |
| 5,337,285 A | 8/1994 | Ware et al. | |
| 6,075,730 A | 6/2000 | Barth et al. | |
| 6,154,821 A | 11/2000 | Barth et al. | |

\* cited by examiner

*Primary Examiner*—Kevin Verbrugge
(74) *Attorney, Agent, or Firm*—Pillsbury Winthrop LLP (57) ABSTRACT

A memory system and a method for controlling power states of a memory device, or a portion thereof, are provided. The memory system includes memory devices, such as DRAMs, a memory controller, chip select lines, and logic for detecting chip select signals from the chip select lines. Each memory device, or a portion therein, is connected to the memory controller by a chip select line. Each chip select line allows the transmission of a chip select signal to a corresponding memory device, or a corresponding portion of the memory device, to select the corresponding memory device, or a portion thereof, to receive commands. Logic is provided to detect the chip select signal. When the logic detects a chip select signal provided to a corresponding memory device, or a portion thereof, that is in a power state lower than its idle state, the memory device, or a portion thereof, is automatically moved from the lower power state to a higher power state.

14 Claims, 6 Drawing Sheets

SYSTEM AND METHOD FOR CONTROLLING POWER STATES OF A MEMORY DEVICE VIA DETECTION OF A CHIP SELECT SIGNAL

BACKGROUND OF THE INVENTION

1. Field of the Invention

The present invention generally relates to controlling power states of memory devices in a memory system, and in particular, to a system and method for utilizing a combination of encoded commands and the presence of a selection mechanism to move the memory devices from one power state to another power state without the need for dedicated pins or wake-up commands. The memory devices may, for example, be dynamic random access memory (DRAM) devices.

2. Related Art

Computer systems often contain one or more integrated circuit (IC) chips that are coupled to memory modules using a memory interface, which provides communication between the IC chips and the memory modules. On the memory modules, there reside memory devices, such as DRAM devices. The IC chips may be memory controllers referred to as chipsets. In some systems, a processor such as the central processing unit (CPU) performs memory controller functions. As used herein, the term memory controller includes such a processor. Increasing demand for higher computer performance and capacity has resulted in a demand for larger memory. However, as the number of memory devices coupled to the memory controller increases, not only do costs of the system increase, but power consumed by operations within the memory devices also becomes significant. Even in their idle states, the memory devices drain power. In a laptop, this lessens the battery power. Moreover, when power is drained, it is converted into thermal energy, heating up components within the system, such as the memory devices and the memory controller. Oftentimes, a fan is provided in the system to dissipate heat, and the turning of the fan further drains power.

Figure 1:
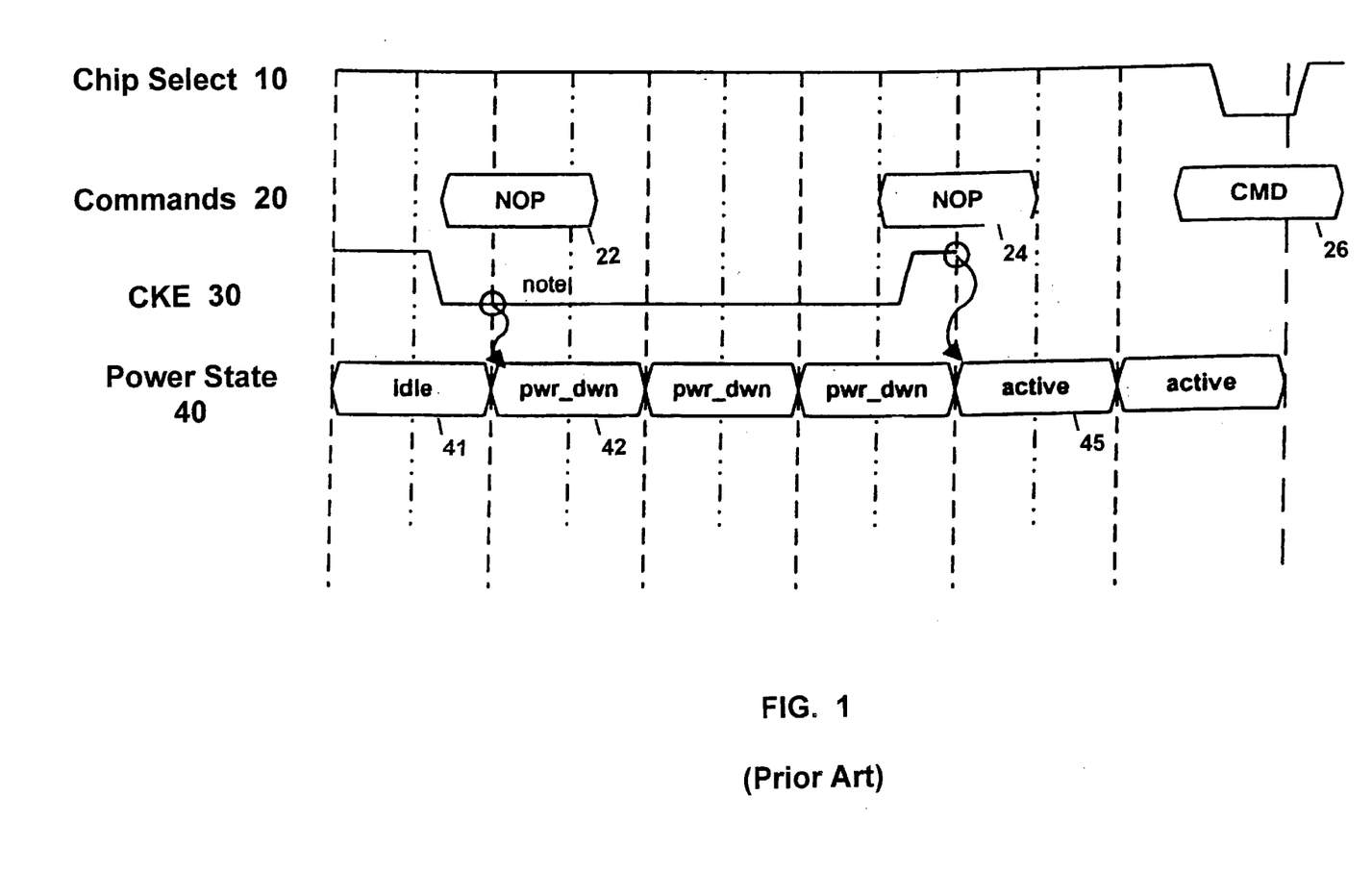
FIG. 1 shows an illustrative example of a timing diagram of a prior art system that utilizes a dedicate control mechanism to control power states of memory devices.

Prior art memory systems have implemented various methods to conserve power of a computer system by controlling power states of the memory devices. Specifically, when a memory device is sensed to be idle for a specific amount of time, the memory device is moved to a lower power state, such as a power-down state and a self-refresh state. For example, in a Synchronous DRAM (SDRAM) system, a dedicated pin is utilized as a power management feature on each DRAM, or a portion of the DRAM. FIG. 1 shows a timing diagram of a prior art SDRAM system that utilizes a dedicate clock enable (CKE) pin with a CKE signal 30 to control power states of each DRAM in the system. A low CKE signal 30 indicates that a DRAM(s) associated with the CKE signal 30 is to enter a low power state. A high CKE signal 30 indicates that a DRAM(s) associated with the CKE signal 30 is to exit a low power state. Besides a CKE signal 30, the timing diagram also shows commands 20, a chip select signal 10, and a power state 40. Based on a command sampled on commands 20 while the CKE signal 30 is low, the DRAM(s) associated with the CKE signal 30 enter different low power states. Based on commands sampled while the CKE signal 30 is high, the DRAM or DRAMs associated with the CKE signal 30 may exit from different low power states and/or enter different high power states. When chip select signal 10 is low, it selects a specific DRAM device or a bank of DRAM devices to receive a normal operation command. The power state 40 shows the power state of the DRAM(s) controlled by the particular CKE signal 30.

As illustrated in FIG. 1, the SDRAM system starts in an idle power state 41. A no-operation command (NOP) 22 is provided while the CKE signal 30 goes low, indicating that the DRAM is to enter a power-down state 42. Providing a different command for self-refresh while the CKE signal 30 is low indicates that the DRAM is to enter a self-refresh state, which dissipates even less power than in a power-down state. The DRAM stays in the power-down state 42 as long as CKE signal 30 remains low. When a high CKE signal 30 and a NOP 24 are sampled, the DRAM exits from the power-down state 42 and enters an active state 45. An exiting delay is associated with exiting a power-down state, where a memory has to wait for all its components to become fully powered before a command can be carried out. As a result, a normal operation command 26, such as a read, is not provided to the DRAM and the chip select 10 is not asserted to receive the command 26 until the exiting delay has elapsed. In certain situation, this results in pipeline stalls. Although the SDRAM system successfully uses dedicated pins, such as a CKE, as a power management feature, such usage is costly. In a common computer system, this would require four to eight dedicated pins on the memory controller to independently control the power states of all banks of DRAMs. Pins would also be required on the DRAMs for them to receive signals from the dedicated pins of the memory controller. More pins translate into more cost and more complication for a memory system.

A different approach is taken by prior art memory systems such as a Direct Rambus DRAM (Direct RDRAM) system. In the Direct RDRAM system, instead of using dedicated pins to control power states of the memory devices, dedicated commands are used to enter and exit low power states. In particular, an exit or wake-up command is required to exit from a low power state, such as a power-down state or a self-refresh state. Consequently, more complex logic must be implemented in the memory devices and the memory controllers to analyze and process the dedicated wake-up commands. This again translates into cost increases for a memory system. Therefore, there is a need for a system and method to control power states of a memory device with the reduction of dedicated pins and complication within a memory system.

DETAILED DESCRIPTION

Figure 2:
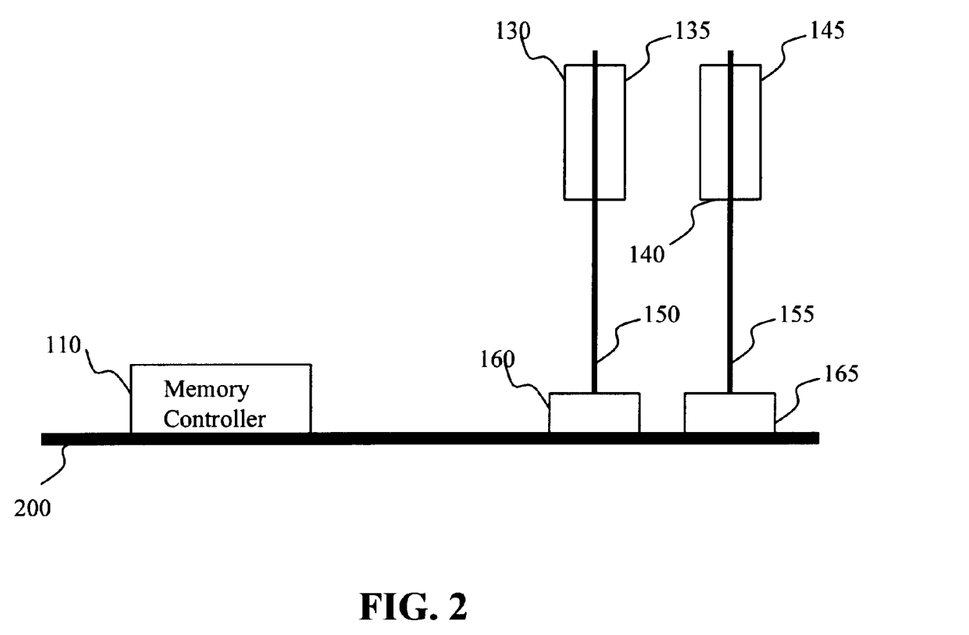
FIG. 2 depicts a memory system at a motherboard level, in which embodiments of the present invention may function.

FIG. 2 depicts a memory system at a motherboard level, in which embodiments of the present invention may function. The memory system comprises a memory controller 110 and memory devices 130–145, such as DRAM devices. The memory controller 110 may, for example, be a chipset or a central processing unit, and it is adapted to transmit different information—e.g., data, address information, and command information—to the memory devices 130–145. The memory controller 110 is further adapted to receive data and status information from the memory devices 130–145. In the memory system, the memory controller 110 resides on a motherboard 200. The memory devices 130–145 reside on memory modules 150, 155. The memory modules 150, 155 are connected to the motherboard 200 through connectors 160, 165. The memory devices 130, 135 reside on the first memory module 150, while the memory devices 140, 145 reside on the second memory module 155. In other memory systems in which the present invention may function, the configuration of the memory devices 130–145 on the memory modules 150, 155 may be different, and the memory controller 110 may control more or fewer memory devices than those shown in FIG. 2. An external buffer(s) or register(s) (not shown) may also be placed between the memory controller 110 and the memory devices 130–145 in the memory system to reduce the impedance seen by the memory controller 110 and improve electrical characteristics of the memory system.

Oftentimes, each of the memory devices 130–145 is further divided into a number of sub-arrays. In the embodiment, each of the memory devices 130–145, or each of the sub-arrays therein, can be thought of as having four different power states. The different power states may be referred to as an active state, an idle state, a power-down state, and a self-refresh state. A memory device, or a sub-array(s) therein, is in an active state when normal operations are performed on the memory device, or the sub-array(s) therein. For example, when read or write operations are performed on the memory device, or the sub-array (s) therein, it is in an active state. Within an active state, there may be several levels of power states because different operations on a memory device use different amount of power. A memory device, or a sub-array(s) therein, is in an idle state when normal operations are not performed on the memory device, or the sub-array(s) therein, and the memory device is not already in a power-down state or a self-refresh state.

A memory device, or a sub-array(s) therein, is in a power-down state after a power-down command is issued to the memory device, or the sub-array(s) therein, with a chip select signal selecting the memory device, or the sub-array (s) therein. The memory controller 110 typically determines whether the memory device, or a sub-array(s) therein, should be in a power-down state. For example, the memory controller 110 may put the memory device, or a sub-array(s) therein, in a power-down state when the memory controller 110 determines that requests presently in its pipeline do not include operations on the memory device, or a sub-array(s) therein. A memory device, or a sub-array(s) therein, is in a self-refresh state after a self-refresh command is issued to the memory device, or the sub-array(s) therein, with a chip select signal selecting the memory device, or the sub-array (s) therein. A self-refresh state involves the whole computer system, and is typically driven by higher order functions, like an operating system or other pieces of hardware. In a self-refresh state, memory devices, such as DRAMs, refresh themselves internally at a very slow rate, while power to the rest of the computer system is shut down and almost all clocks are disabled. The refresh is done to maintain data coherency.

Figure 3:
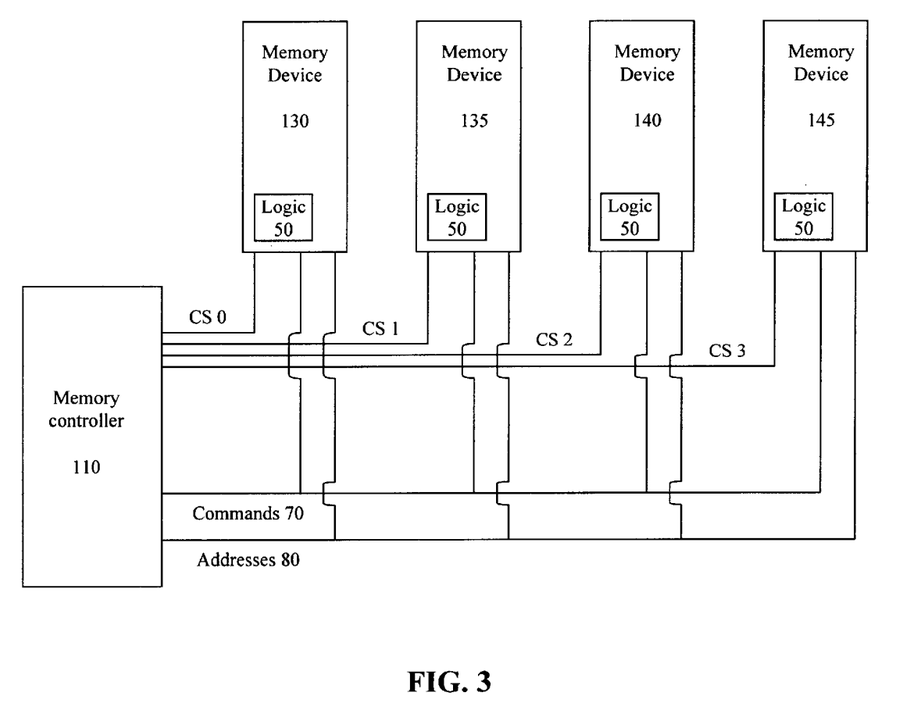
FIG. 3 illustrates a diagram of a memory system according to an embodiment of the present invention.

FIG. 3 illustrates a memory system according to an embodiment of the present invention. The memory system comprises a memory controller 110, memory devices 130–145, logic 50 in each of the memory devices 130–145, and communication lines between the memory controller 110 to the memory devices 130–145. In other embodiments, there may be more or fewer memory devices than those shown in FIG. 3. The communication lines include chip select (CS) lines from the memory controller 110 to the memory devices 130–145, with CS 0, CS 1, CS 2 and CS 3 connecting to memory devices 130, 135, 140 and 145, respectively. The CS lines are for the CS signals. A CS signal refers to any type of signal that selects a specific memory device, specific portion of a memory device, or a group of memory devices. It can be thought of as a signal that causes the selected device(s) or portion(s) to take notice of command inputs. In the embodiment, there is one CS per memory device. In other embodiments, there may be more or fewer chip selects because the number of the memory devices or the number of chip selects per memory device may vary. For example, a memory device may be further divided into sub-arrays, with CS lines being provided from the memory controller 110 to the sub-arrays within the memory device. In another memory system, there may be two chip selects—a column chip select and a row chip select—per memory device, or a sub-array therein, for providing concurrent row and column operations on the memory device, or the sub-array therein.

The communications lines further include lines or buses for transmitting commands 70 and addresses 80, which broadcast their commands or addresses to all the memory devices 130–145. Connected to one end of the command buses/lines is a collection of pins at the memory controller 110 that allows commands 70 to be provided to the command buses/lines. Connected to the other end of the command buses/lines is a collection of pins at the memory devices 130–145 that receives commands 70 from the command buses/lines. Address buses/lines are also connected by collections of pins at the memory controller 110 end and the memory devices 130–145 end. Commands 70 and addresses 80 are sampled with an assertion of CS either on the edge of a clock or by some other method. In other embodiments, individual signal/bus lines for commands and addresses are provided to each memory devices to allow separate control of the individual memory devices 130–145.

In the memory system, there resides the logic 50 for detecting the presence of a CS signal at the memory devices 130–145, or sub-arrays therein. The logic 50 is any mechanism that takes a device selection mechanism, such as the CS signal, and uses it to exit a device, or a portion thereof, from a low power state. In this embodiment, the logic 50 is shown to reside in each of the memory devices 130–145. In other embodiments, the logic 50 may reside in other components in the memory system, or different logic may be provided to different memory devices to provide individualized control of the memory devices. The logic 50 is utilized to facilitate the control of power states in the memory system, specifically the memory devices 130–145, or sub-arrays therein. Assuming that the memory device 130, or a portion thereof, is in a power state lower than its active state ("low power state", the logic 50 automatically causes the memory device 130, or a portion thereof, to leave the low power state upon detection of an assertion or edge transition of a CS signal to the memory device 130, or a potion thereof. The assertion or edge transition of the CS signal may be detected by providing an external clock to the logic 50, allowing the logic 50 to sample on the edge of the external clock to see if there is an assertion or edge transition of the CS signal. In a low power state, where clock inputs to the rest of the memory device 130 may be disabled, the logic 50 remains awake to detect any assertion or edge transition of the CS signal. The low power state may, for example, be a power-down state, self-refresh state, and an idle state. When the memory device 130 exits the low power state, it is moved to a higher power state, such as an active state that allows the memory device 130 to carry out commands 70 sampled at the CS assertion from the command buses/lines. In one implementation, the higher power state is not an active state, but an idle state. In another implementation, the higher power state may also be a power-down state if the low power state is a self-refresh state.

Using the combination of a CS assertion, such as one from CS 0, and the logic 50 to detect the CS assertion, the power states of the memory devices 130–145, or a portion thereof, are controlled. For example, the memory device 130 may be in a low power state, such as a power-down state or a self-refresh state. If the logic 50 of the memory device 130 detects the assertion or an edge transition on the CS 0, or any device-selection mechanism for selecting the memory device 130, the memory device 130 automatically exits from a low power state and enters into a higher power state. Dedicated control mechanisms, such as a SDRAM system providing dedicated CKE pins or a Direct RDRAM system providing dedicated wake-up commands, to exit from a low power state are no longer needed. As a result, costs of memory devices and memory systems are decreased and implementations of the memory devices and memory systems are simplified.

Similarly, the same advantages are achieved when the memory systems of the present invention move from a higher power state to a low power state. Instead of using a dedicated control mechanism, embodiments of the present invention utilize the existing selection mechanisms and command buses/lines. Commands to move the power state of a memory device, or a portion thereof, from a higher power state to a low power state are encoded with the normal operation commands of a memory system. Examples of the encoded high to low power state commands are a power-down command and a self-refresh command. Examples of the normal operation commands are a read command, a write command, a pre-charge command, and an active command. With respect to the memory device 130, or a portion thereof, when a CS 0 is asserted at the memory device 130, or a portion thereof, the command on the command buses/lines are sampled. When a power-down command is sampled, the memory device 130, or a portion thereof, moves to the power-down state. When a self-refresh command is sampled, the memory device 130, or a portion thereof, enters the self-refresh state. No dedicated pin is required to make the memory device 130, or a portion thereof, enter a lower power state. As a result, costs from having to implement dedicated pins, not only on the memory device 130 but also on the memory controller 110, are saved.

According to an embodiment, all memory devices in a computer system, for example, the memory devices 130–145, are requested to enter a self-refresh state. In a self-refresh power state, the memory devices 130–145 refresh themselves internally at a very slow rate, while power to the rest of the computer system is shut down and almost all clocks are disabled. Since all memory devices are to enter the self-refresh state, all chip select signals, for example, the CS 0–3, are simultaneously asserted. A self-refresh command is provided on the command buses/lines and sampled by the memory devices 130–145 upon the assertion of the CS 0–3. This causes the memory devices 130–145 to enter the self-refresh state. The power to the rest of the computer system and almost all clocks are then shut down and disabled by an operating system, a central process unit, or another piece of hardware. To keep self-refreshing the memory devices, a small piece of logic in the computer system remains powered up, including a portion of the memory devices 130–145. When the power returns and the clocks are enabled and the computer system desires for the memory devices 130–145 to exit the self-refresh state, the CS 0–3 are asserted again. The CS 0–3 assertions may, for example, be a network signal or a user event, such as moving a mouse or typing on a keyboard. The logic 50 detects the assertions of CS 0–3 and wakes up the memory devices 130–145. Any command can be implemented with the CS 0–3 when waking up the memory devices 130–145, including a no-operation or null command. In other embodiments, the computer system may wake up only the memory device, or a portion thereof, that the computer system needs by asserting a CS signal to only the memory device, or a portion thereof. This way, only the memory device, or a portion thereof, the system needed exits the self-refresh state, while the other memory devices remain in the self-refresh state to save power. The system may also issue a normal operation command, such as a read, along with the assertion of the CS signal when exiting the self-refresh state.

According to an embodiment, the logic 50 is implemented by an edge detection device. In other embodiments, the logic 50 may be implemented by a level detection device. The edge detection device performs edge detection on an assertion of a CS. By using the edge detection device, the memory system can disable all clock inputs to the memory device. Clocks to the memory devices are turned off, and the memory device is even in a lower power state than a power-down state or a self-refresh state. The power conserved by a memory system with memory devices having no clock inputs becomes significant when many memory devices are present in the memory system. When a CS signal is received by the memory device, the edge detector detects the edge of the CS signal and starts the clock inputs. At this point, the memory device exits from its low power state. In prior art memory systems, clocks must remain active to at least a small portion of the core logic of the memory device to analyze and process either signals from dedicated pins and commands from command bus lines or dedicated commands to control the power states. Specifically, clocks must remain active for power state specific commands, such as a no-operation command or a dedicated wake-up command, to be sampled. With the edge detection device, clocks do not need to be provided to this small portion of the core logic. This allows the memory device to dissipate less power than even conventional memory devices in their lowest power state.

Figure 4:
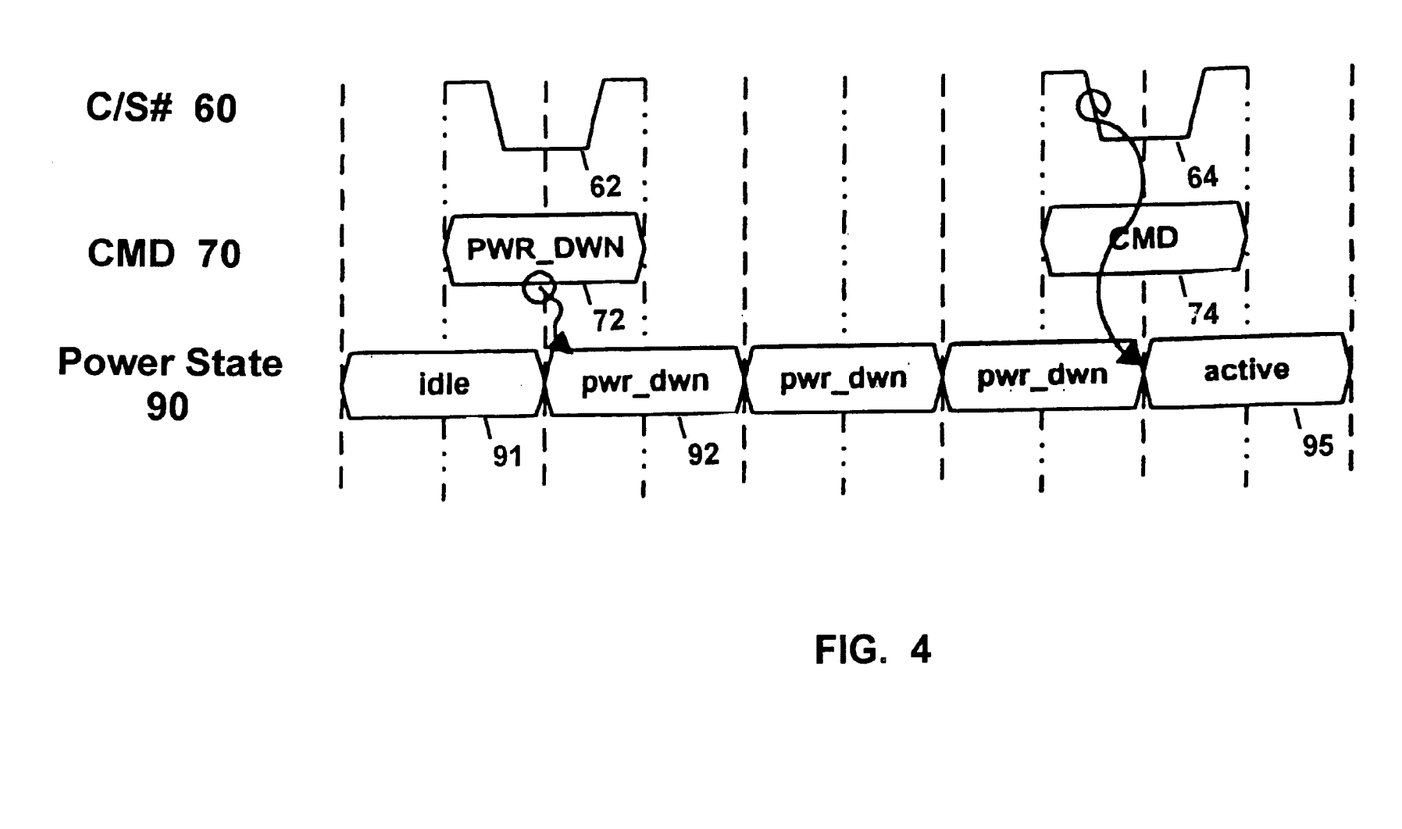
FIG. 4 shows an illustrative example of a timing diagram of a memory system according to an embodiment of the present invention.

FIG. 4 shows an illustrative example of a timing diagram of a memory system according to an embodiment of the present invention. The timing diagram illustrates the effect of utilizing a CS assertion and logic to detect the CS assertion in embodiments of the present invention. An illustrative example of the CS assertion may be from any one of CS 0–3, and an example of the logic to detect the CS assertion is logic 50. In this example, the power states of a memory device, or a sub-array, selected by a CS signal (C/S#) 60 are shown. The memory device, or the sub-array, goes through two power state transitions. The first transition is from an idle state to a power-down state, and the second transition is from the power-down state to an active state.

The first signal in the timing diagram of FIG. 4 represents the C/S#60. The C/S#60 selects a specific memory device, a portion of a memory device, or a group of memory devices to receive a command on the command buses/lines. The C/S#60 is active-low in this example, but can be any type of signal that selects a specific memory device or devices to receive a command. In other embodiments, the C/S#60 may be implemented active-high, i.e., the CS signal selects a memory device when there is a rising edge in the CS signal. The second signal represents commands 70 ("CMD"). The CMD 70 is a signal from a collection of pins on the memory controller 110 that provides commands to the memory device. CMD 70 is sampled with the assertion of C/S#60, either on the edge of a clock or by some other method. Examples of CMD 70 include commands related to power states, such as power-down and self-refresh, and commands related to normal operations of the memory devices, such as read, write, pre-charge and activate. The third signal in the timing diagram is power state 90, which is a representation of the power state of the memory device, or a portion thereof, selected by the C/S#60. In other embodiments, power state 90 may represent the power state of a number of memory devices.

As shown in power state 90, the memory device, or a portion thereof, starts in an idle state 91. The idle state 91 indicates that no normal operation, such as read or write, is being performed on the memory device. An operating system or a control unit monitoring the memory device, or a portion thereof, detects that the memory device has been idled for a period of time and decides that the memory device, or a portion thereof, is to be moved from the idle state 91 to a power-down state. The C/S#60 associated with the memory device, or a portion thereof, is asserted with C/S#62, causing the memory device, or a portion thereof, to receive a command on CMD 70. When a power-down command (PWR_DWN) 72 on CMD 70 is sampled, the memory device, or a portion thereof, is moved to a power-down state 92 (pwr_dwn 92). In other embodiments, the command sampled on CMD 70 may be a self-refresh command, and the memory device is moved to a self-refresh state. The memory system, or a portion of, remains in the power-down state 92 until another C/S#60 assertion is received or edge transition of C/S#60 is detected. The next CS/#60 assertion, C/S#64, selects the memory device, or a portion thereof, to receive a command 74 on CMD 70. More importantly, the assertion of C/S#64 automatically causes the memory device, or a portion thereof, to leave the power-down state 92. Logic or a detection device embedded in the memory device detects the assertion of C/S#64 and causes the memory device, or a portion thereof, to exit from the power-down state 92 and enter an active state 95. In the active state 95, the memory device, or a portion thereof, is powered up again for carrying out the command 74. The command 74 is preferably any kind of normal operation command in the memory device.

An added benefit of this new technique for exiting the low power state is the ability for the memory controller 110 to issue a normal operation command to the memory device being selected by the C/S#60 while moving it to the active state 95. As illustrated in FIG. 4, the assertion of the C/S#60 causes the memory device to leave the power-down state 92 and enter the active state 95, or "wake-up," and the command 74 issued with the assertion of the C/S#60 is also sampled by the memory device on the same clock. Since no dedicated wake-up command needs to be implemented, the command 74 can be, for example, a read or any normal operation command to the memory device, or a portion thereof. In prior art memory systems, either dedicated pins with null commands such as NOP or dedicated wake-up commands are utilized. By being able to issue a normal operation command while activating the memory device, or a portion thereof, the normal operation command is issued at least one clock cycle earlier than it would be in the prior art systems. The command 74 does not have to wait until a null command or a dedicated wake-up command is completed before the command 74 is issued. This means commands on CMD 70 are compressed, improving command bandwidth. This translates into improved data bandwidth because more commands can be issued to keep data buses busier.

Moreover, additional benefits are realized by being able to issue a command earlier in command lines/buses. There is usually an exiting delay that a memory device just waking up, or exiting from a low power state, such as a power-down or self-refresh, has to wait before all components for carrying out a command is at full power. Without waiting for the exiting delay, the memory device cannot operate the command. For example, all internal clocks within the memory device need to be running to operate certain commands. Depending on how long the memory device just exiting the power-down state 92 has to wait before carrying out the command 74, the memory device may or may not require additional delay to compensate for the exiting delay. If the exiting delay is long, an added latency is provided to delay the memory device from carrying out the command 74 until the exiting delay has elapsed. The added latency may, for example, be a pre-agreed added latency by the memory controller 110 and the memory device or a programmable/variable added latency. The memory controller 110 compensates for the added latency by spending the waiting time to determine parameters necessary for carrying out certain commands or the length of time for commands to be completed by the memory device. For example, if command 74 is a read command, the memory controller 110 may spend the waiting time determining when read data would be returned from the memory device. If the memory controller 110 were to spend time determining these parameters once the exiting delay has elapsed and the memory device is ready to carry out the command 74, pipeline stalls may occur. The memory system can also compensate the added latency by being able to start working on commands after the command 74 during the added latency and determine their parameters. This allows the memory system to keep moving its command pipeline. This is advantageous when there is a very deep pipeline that is backed up with a number of read commands. In prior art SDRAM systems, after a NOP command is issued, with a CKE signal being high, to activate a memory device from a power-down state, the exiting delay is waited before a normal operation command is even sampled. This wait period could be several clocks after a memory device exits the power-down state. Thus, the ability to issue a command with the "wake-up" event allows the memory system to more efficiently utilize the command buses/lines and reduces the likelihood of pipeline stalls.

Figure 5:
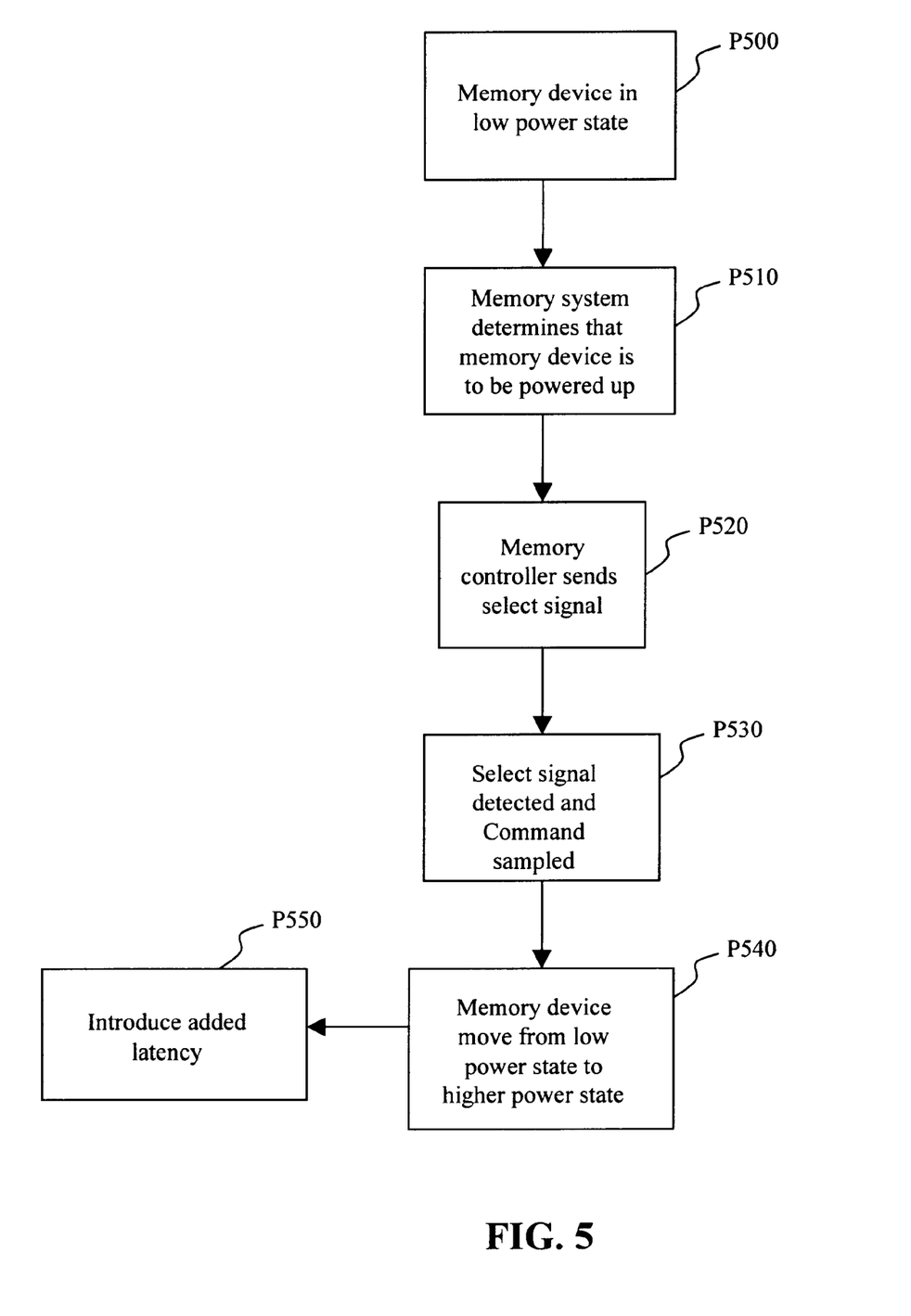
FIG. 5 shows an illustrative example of the processes for operating a memory system to move memory arrays within the memory system from a lower power state to a higher power state according to an embodiment of the present invention.

FIG. 5 shows an illustrative example of the processes for operating a memory system to move memory arrays within the memory system from a lower power state to a higher power state according to an embodiment of the present invention. The memory system includes a memory controller, memory devices, a selection mechanism to each memory device for causing each memory device to receive a command, and logic for detecting an assertion of the selection mechanism and controlling power states of the memory devices. In block P500, a memory device within the memory system is in a low power state, such as a power-down state or a self-refresh state. In other embodiments, the memory device may be in an idle state. In block P510, the memory system determines that the memory device is to be powered up and move from a lower power sate to a higher power state. Various components within the memory system may request the memory device, or a portion thereof, to be powered up, or wakened up. These components include an operating system, a central processing unit, the memory controller, or other hardware devices. In block P520, a component in the memory system, preferably a memory controller, sends a select signal to the memory device. In block 530, the select signal is detected in the memory system, preferably with logic residing in the memory device. In block 540, based on the detection of the select signal, the memory device is automatically moved from the lower power state to the higher power state. For example, the memory device may be moved from a power-down state to an active state, or a self-refresh state to an active state.

At the same time that the select signal is detected, the memory device also samples a command upon receiving the select signal, as shown in block 530. The sampled command may, for example, be a normal operation command selected from the group of a read command, a write command, a pre-charge command, and an active command. The ability to sample a normal operation command while the memory device is being moved to the higher power state is advantageous. Command bandwidth is increased because commands are able to be issued earlier. In one embodiment, an added latency is introduced after the memory device is moved to the higher power state, as shown in block 550. The added latency provides delay time for the memory device to get ready for carrying out the sampled command. The delay time after sampling the command is also utilized to determine parameters necessary for carrying out the sampled command or sample the next command and commands thereafter.

Figure 6:
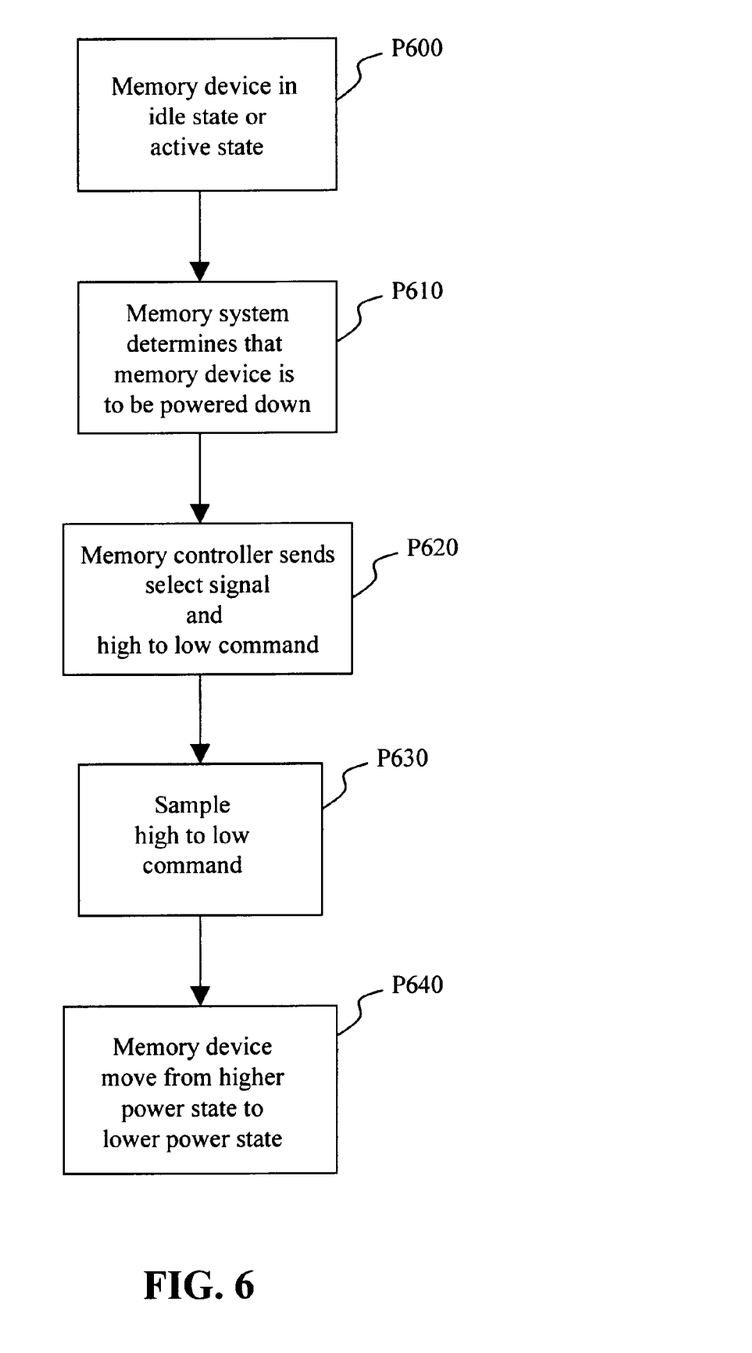
FIG. 6 shows an illustrative example of the processes for operating a memory system to move memory arrays within the memory system from a higher power state to a lower power state according to an embodiment of the present invention.

FIG. 6 shows an illustrative example of the processes for operating a memory system to move memory arrays within the memory system from a higher power state to a lower power state. In block P600, a memory device within the memory system is in an active state or an idle state. In other embodiments, the memory device may be in a power-down state. In block P620, the memory system determines that the memory device is to be powered down and moved from a higher power sate to a lower power state. For example, the memory device may be moved from an idle state to a power-down state, or an idle state to a self-refresh state. Various components within the memory system may request the memory device, or a portion thereof, to be powered down. These components include an operating system, a central processing unit, the memory controller, or other hardware devices. In block P620, a component in the memory system, preferably a memory controller, sends a select signal to the memory device and a high to low command. Examples of the high to low command may, for example, be a power-down command or a self-refresh command. In block 630, upon receiving the select signal, the memory device samples the high to low command. In block 640, based on the select signal and the sampled high to low command, the memory device is moved from the higher power state, such as the idle state and the active state, to the lower power state.

Embodiments of the invention and method as set forth above uses a combination of encoded commands and the presence of a CS or other memory device selection mechanism to efficiently move memory devices into various power states without the need for dedicated pins or dedicated wake-up commands. Eliminating dedicated pins, such as the CKE pins in a SDRAM system, decreases costs of a memory system. Fewer pins are needed in both the memory controller and the memory devices, and fewer communication paths are required between the memory controller and the memory devices. This means costs associated with the memory controller, the memory devices, and the memory interface are decreased, reducing the cost of the memory system. Eliminating the need for dedicated exit or wake-up commands, such as those in a Direct RDRAM system, simplifies logic needed in a memory system. Complex logic needs not be implemented for providing, receiving and analyzing the dedicated wake-up commands. This further decreases costs of the memory system.

While the description above refers to particular embodiments of the present invention, it will be understood that many modifications may be made without departing from the spirit thereof. The accompanying claims are intended to cover such modifications as would fall within the true scope and spirit of the present invention. The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. A memory system, comprising:

at least one memory device for storing data;

a memory controller that sends data and signals to the at least one memory device;

a chip select line that connects the memory controller and the at least one memory device, or a portion thereof, the chip select line allowing the transmission of a chip select signal to the at least one memory device, or the portion thereof, the chip select signal selecting the at least one memory device, or the portion thereof, to sample commands; and an edge detection device implementing logic for detecting an edge of an assertion of the chip select signal, wherein when the logic detects the edge of the chip select signal provided to the at least one memory device, or the portion thereof, that is in a power state lower than its active state, the at least one memory device, or the portion thereof, is automatically moved from the lower power state to a higher power state, and all clock inputs to the at least one memory device, or the portion thereof, are disabled to conserve power when the at least one memory device, or the portion thereof, is in the lower power state.

2. The memory system of claim 1, wherein the lower power state to the higher power state is selected from the group of a power-down state to an active state, a power-down state to an idle state, an idle state to an active state, a self-refresh state to an active state, a self-refresh state to an idle state, and a self-refresh state to a power-down state.

3. The memory system of claim 1, further comprising a command communication path for transmitting commands from the memory controller to the at least one memory device, wherein when the chip select signal is provided to the at least one memory device, or the portion thereof, that is in the lower power state, a command on the command communication path is sampled while the at least one memory device, or the portion thereof, is being moved to the higher power state.

4. The memory system of claim 3, wherein the sampled commands are operation commands selected from the group consisting of a read command, a write command, a pre-charge command, and an activate command.

5. The memory system of claim 3, further comprising a latency adding device for introducing an added latency after the logic detects the chip select signal and the at least one memory device, or a portion thereof, is moved to the higher power state, the added latency providing delay time before the sampled command is ready to be operated on the at least one memory device, or a portion thereof.

6. The memory system of claim 5, wherein the memory system determines parameters necessary for carrying out the sampled command during the added latency.

7. The memory system of claim 5, wherein a second normal operation command is sampled during the added latency.

8. The memory system of claim 1, further comprising a command communication path for transmitting commands from the memory controller to the at least one memory device, the commands including high to low commands encoded for moving the at least one memory device, or a portion thereof, from a higher state to a lower state, wherein when the chip select signal and a high to low command are both provided to the at least one memory device, or a portion thereof, that is in a higher power state, the at least one memory device, or a portion thereof, moves from the higher power state to a lower power state.

9. The memory system of claim 8, wherein the high to low commands include a power-down command and a self-refresh command, the higher power state to the lower power state being selected from the group of an active state to an idle state, an active state to a power-down state, an active state to a self-refresh state, an idle state to a power-down state, an idle state to a self-refresh state, and a power-down state to a self-refresh state.

10. The memory system of claim 8, wherein the commands transmitted through the command data bus are further selected from the group of a read command, a write command, a null command, a pre-charge command, and an activate command.

11. A memory device, comprising:
a chip select pin for receiving a chip select signal that selects the memory device, or a portion thereof, to receive a command to be operated on the memory device;
command pins for receiving the command; and
an edge detection device implementing logic for detecting an edge of an assertion of the chip select signal, wherein when the chip select signal is received by the memory device, or the portion thereof, that is in a power state lower than its active state, the logic detects the edge of the chip select signal and the command received by the memory device, the memory device, or the portion thereof, being automatically moved from the lower power state to a higher power state, and all clock inputs to the at least one memory device, or the portion thereof, are disabled to conserve power when the at least one memory device, or the portion thereof, is in the lower power state.

12. The memory device of claim 11, wherein the received command is a normal operation command selected from the group of a read command, a write command, a pre-charge command, and an activate command.

13. The memory device of claim 11, wherein an added latency is introduced after the logic detects the chip select signal and the memory device, or a portion thereof, is moved to the higher power state, the added latency providing delay time before the sampled command is ready to be operated on the memory device, or a portion thereof.

14. The memory device of claim 11, wherein the received command includes high to low commands encoded for moving the at least one memory device, or a portion thereof, from a higher state to a lower state, wherein when the chip select signal and a high to low command are both provided to the at least one memory device, or a portion thereof, that is in a higher power state, the at least one memory device, or a portion thereof, moves from the higher power state to a lower power state.

* * * * *